US012666929B2

(12) United States Patent
Wang et al.

(10) Patent No.: US 12,666,929 B2
(45) Date of Patent: Jun. 23, 2026

(54) SYSTEM AND METHOD FOR DETECTING DEFECTS ON A WAFER AND RELATED NON-TRANSITORY COMPUTER-READABLE MEDIUM

(71) Applicant: TAIWAN SEMICONDUCTOR MANUFACTURING COMPANY LTD., Hsinchu (TW)

(72) Inventors: Shih-Chang Wang, Tainan City (TW); Hsiu-Hui Huang, Hsinchu City (TW); Feng-Ju Chang, Hsinchu City (TW); Yen-Fong Chan, Hsinchu County (TW); Chien-Huei Chen, Kaohsiung City (TW); Xiaomeng Chen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 987 days.

(21) Appl. No.: 17/842,760

(22) Filed: Jun. 16, 2022

(65) Prior Publication Data

US 2023/0411224 A1     Dec. 21, 2023

(51) Int. Cl.
*H10P 74/20* (2026.01)
*G06T 7/00* (2017.01)
*H01J 37/28* (2006.01)
*H10D 30/67* (2025.01)

(52) U.S. Cl.
CPC .......... *H10P 74/203* (2026.01); *G06T 7/0006* (2013.01); *H01J 37/28* (2013.01); *H10D 30/6735* (2025.01); *G06T 2207/10061* (2013.01); *G06T 2207/30148* (2013.01); *H01J 2237/2817* (2013.01)

(58) Field of Classification Search
CPC . G06T 7/0006; H01J 37/28; H01J 2237/2817; G03F 7/7065
See application file for complete search history.

(56) References Cited

U.S. PATENT DOCUMENTS

2017/0212168 A1*   7/2017   Leu ..................... G01R 31/3177
2024/0062356 A1*   2/2024   Xu ......................... G06T 7/0004

* cited by examiner

*Primary Examiner* — Brian Turner
(74) *Attorney, Agent, or Firm* — WPAT LAW; Anthony King

(57) ABSTRACT
A system configured to detect defects on a wafer is provided. The system includes an inspection subsystem configured to acquire scan data of a target region on the wafer. The target region comprises a plurality of circuit layout streaming data on the wafer and the defects in proximity to the circuit layout streaming data or in the circuit layout streaming data. A graphic design subsystem (GDS) is configured to store a map of circuit layout streaming data of the wafer. A software tool for designing electronic systems is configured to label the scan data with attributes from the map of circuit layout streaming data. A decision subsystem is configured to qualify the process based on a predetermined defect level from the labeled scan data by using a multi-dimension clustering method, wherein the predetermined defect level is an accumulated defect formed on the semiconductor wafer during processing.

20 Claims, 11 Drawing Sheets

100

The creation of all-possibility map of circuit layout streaming data ∽201

Scan result (scan data) labeled with circuit layout streaming data ∽202

The grouping by using a multi-dimension clustering method ∽203

Using grey level gain and image filter ∽204

Picking up the outliers from each group ∽205

DOI collection ∽206

Calibration (RSEM / TEM / cAFM) ∽207

The calibrated result labeled to multi-dimension group ∽208

ADC tuning ∽209

Final Map & Report ∽210

200

Acquiring scan data of a target region on the wafer

802

Labeling the scan data with attributes from the map of circuit layout streaming data

803

Determining a process healthiness from the labeled scan data by using a multi-dimension clustering method and a predetermined value

800

SYSTEM AND METHOD FOR DETECTING DEFECTS ON A WAFER AND RELATED NON-TRANSITORY COMPUTER-READABLE MEDIUM

TECHNICAL FIELD

The present disclosure relates, in general, to an electron beam inspection (EBI) detection model and to systems and methods for operating the same. Specifically, the present disclosure relates to an EBI detection model with improved sensitivity and throughput.

BACKGROUND

The process control of a scale of a semiconductor structure under 5 nm (nanometers) relies on EBI inspection. In order to detect weak-signal defects, EBI inspection tools are commonly operated in high sensitivity mode with low throughput. Therefore, an improved EBI detection model is required.

In conventional EBI inspection, grey level difference (ΔGL) is the major attribute used to distinguish defect of interest (DOI) and nuisance. In order to detect weak-signal defects, lower thresholds will usually be set up, which dramatically increase nuisance rates. However, these EBI signals also carry diverse and useful information, such as circuit layout streaming data, which are not popularly utilized. Without proper grouping of huge amounts of EBI data, weak signal defects can be hidden under one-dimensional (i.e. grey level, GL) distribution.

In one EBI scan test, only one kind of brightness and contrast can be set up. If defects in different environments (such as isolated and dense logic) need to be detected simultaneously, more than one scan test must be set up according to different brightness levels. Therefore, throughput can be reduced. In addition, wafers can be damaged due to repeated EBI scans.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 2 is a flowchart of an embodiment of a method of defect detection on a wafer in accordance with some embodiments of the present disclosure.

DETAILED DESCRIPTION

Figure 1:
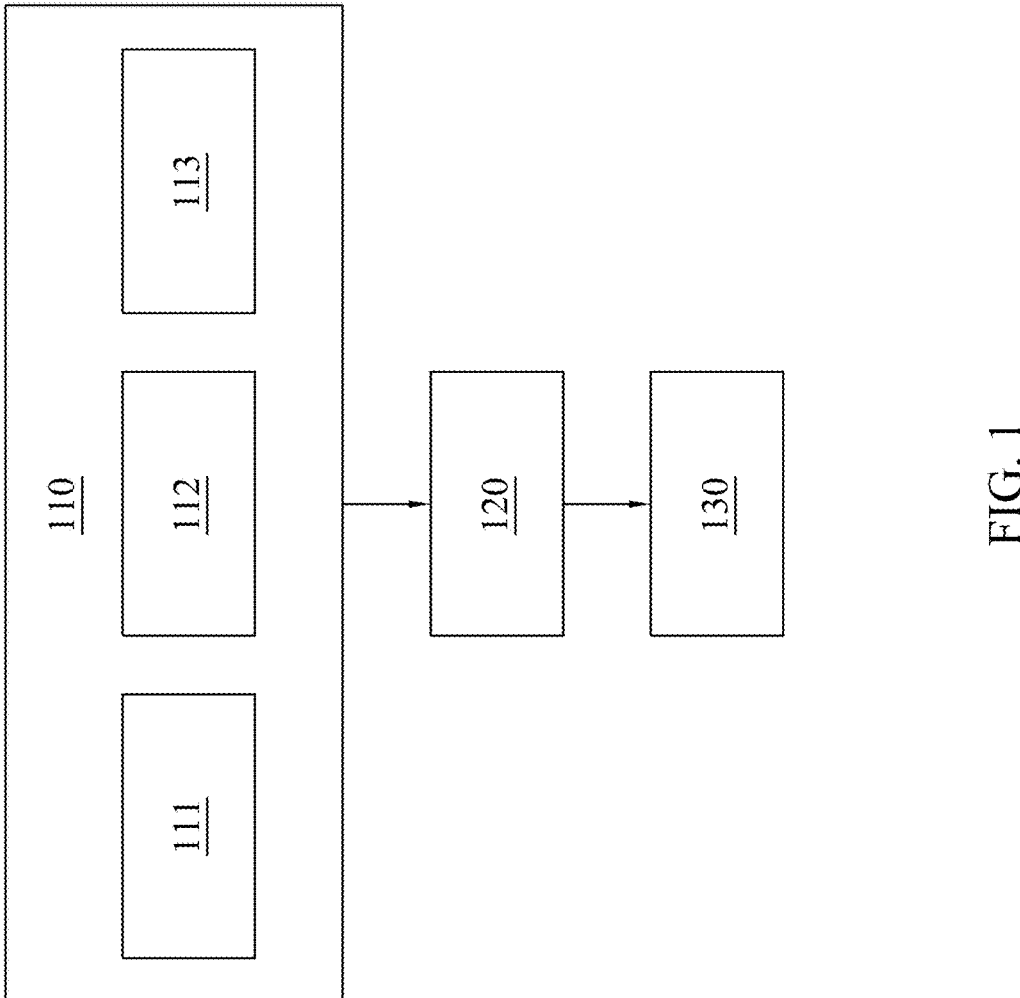
FIG. 1 is a diagram of a system in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A novel EBI inspection model/system can (a) enhance the purity of the EBI DOI detection; (b) locate unknown defect types; and (c) improve the EBI throughput and reduce EBI damage risk. In order to detect weak-signal defects, lower thresholds are usually set up, which can increase nuisance rates. What is thus required is a novel inspection model/ system labeling scan data with attributes from the layout-feature map of circuit layout streaming data and identifying defects from the labeled scan data using multi-dimensional clustering. Some exemplary operations of defect detection on a wafer are disclosed as follows. In some embodiments, the EBI scan result will have multiple-layout features (such as a circuit layout streaming data) added thereto. In some embodiments, the circuit layout streaming data format may be GDSII (Graphical Design System/Graphic Data System) or OASIS (Open Artwork System Interchange Standard). The labeled layout features (such as labeled circuit layout streaming data) will obtained from (a) defect lesson learned; (b) process weakness information; (c) all pattern types; (d) pattern density distribution; and (e) all possibilities.

This present disclosure acquires more useful attributes based on circuit layout streaming data which can help enhance differentiation of defects from nuisances, and identify defect types from the image. The present disclosure can help to identify unknown defects. The EBI inspection system can (a) enhance the purity of EBI defect of interest (DOI) detection; (b) identify unknown defect types; and (c) improve EBI throughput, reduce EBI damage risk, and (d) analyze circuit layout streaming data and monitor process variation. The EBI scan results, combined with the layout information, can enhance prediction of defect root causes and shorten the yield-learning cycle. The scan result of the present disclosure could be labeled with layout information. The labeled scan result can help to clarify the defect caused by (a) overlay issue; (b) etch issue and (c) process weak points.

FIG. 1 is diagram of a system 100 in accordance with some embodiments of the present disclosure. FIG. 1 shows a system 100. The system 100 includes a computer system 110 and inspection subsystem 120. A sample/wafer 130 is detected by the inspection subsystem 120. In some embodiments, the inspection subsystem 120 may be an electron beam inspection (EBI) subsystem. In some embodiments, the system 100 is configured to detect defects on a surface of the wafer 130.

In some embodiments, the wafer 130 (e.g., a patterned semiconductor wafer) is arranged to be detected by the inspection subsystem 120. In some embodiments, the inspection subsystem 120 may comprise, for example, a scanning electron microscope (SEM) or an optical inspection device, or any suitable type of inspection device known in the art. The inspection subsystem 120 may examine the surface of wafer 22, sense, detect and process the scanned results, and output the inspection data/result, including, for example, scan data of a target region and defective images on the wafer 130. In some embodiments, the inspection data may include the location, size, and shape of defects found on the wafer and the defect content and/or any other suitable features known.

In some embodiments, the "scan data" may refer to the SEM images and related intermediaries, this term should be interpreted broadly to mean any or all kinds of characteristic data. The scan data can be collected and processed to identify the characteristics of the defect, regardless of the manner in which the data is collected, and whether the data is on the entire wafer or in part of the wafer. Some embodiments of the present disclosure are applicable to the analysis of defects identified by an inspection system that scans the wafer and provides a list of locations of suspected defects. Other embodiments of the present disclosure are applicable to defect analysis which may be repeatedly detected by a tool based on the location of the suspected defect provided by an inspection tool. The invention is not limited to any particular technique by which inspection data may be generated.

In some embodiments, the inspection subsystem 120 is configured to acquire scan data of a target region on the wafer 130. The target region comprises a plurality of circuit layout streaming data on the wafer and the defects in proximity to the circuit layout streaming data or in the circuit layout streaming data. In some embodiments, the circuit layout streaming data includes vias, metal lines, and/or other conductive components. The computer system 110 includes a software tool for designing electronic systems 111 (such as: an electronic design automation (EDA) tool), a graphic design subsystem (GDS) 112, and a decision subsystem 113. The GDS 112 is configured to store a layout feature map of circuit layout streaming data of the wafer, generated as a GDS file. The layout feature map of circuit layout streaming data was created based on defect lessons learned and all layout possibilities (e.g. process information, layout properties, pattern types, pattern densities, etc.).

The a software tool for designing electronic system 111 is configured to label the scan data with attributes from the map of circuit layout streaming data. The result of the scan data with GDS locations can be labeled with different useful attributes by where the position located in the map of circuit layout streaming data. Using the operation, 100 k defects can be labeled within 10 minutes (speed based on server power). The decision subsystem 113 is configured to determine defects from the labeled scan data using multi-dimensional clustering, wherein the defects are formed on the semiconductor wafer during an Extreme ultraviolet lithography (EUV) process. In some embodiments, the decision subsystem 113 is configured to qualify the process based on a predetermined defect level from the labeled scan data by using a multi-dimension clustering method, wherein the predetermined defect level is an accumulated defect formed on the semiconductor wafer during processing. In some embodiments, the scan data is acquired based on an EBI image. The EBI image includes the circuit layout streaming data and the defects.

The circuit layout streaming data comprises vias, metal lines and/or channels. In some embodiments, the attributes for a target via may include a length of a via, a width of the via, and the distance between the via and an adjacent via. In some embodiments, the attributes for a target metal line include a pattern density of a metal line, a connection type between the metal line and a via underlying the metal line, and a connection type between the metal line and a second metal line underlying the metal line.

The improved detection method can measure all types of defect. In some embodiments, defects in the metal lines of the semiconductor structure caused by different reasons may include (a) the relationship between the short circuit/broken circuit of the metal line and the connection via; (b) the relationship between the short circuit/broken circuit of the metal line and the surface topography (topo) of the structure; (c) the enhanced measurement of the special metal line; and (d) high identification for defects in the high resistance of the metal line.

In some embodiments, defects in the channel of the semiconductor structure caused by different reasons may include (a) the damage of the source/drain channel (EPI), the relationship between source/drain channel (EPI) and cut-channel, and the relationship between the damage of the source/drain channel (EPI) and the channel environment; (b) the short circuit/broken circuit between the source/drain connecting metal (MD) and the source/drain channel (EPI); (c) the environments of the source/drain connecting metal (MD) and the source/drain channel (EPI); (d) the short circuit/broken circuit between the metal gate and source/drain connecting metal (MD); (f) the reasons for forming the short circuit/broken circuit of the channel.

FIG. 2 is a flowchart of an embodiment of a method of defect detection on a wafer in accordance with some embodiments of the present disclosure. The method includes the creation of an all-possibility map of circuit layout streaming data (block 201). In some embodiments, the target region is given the circuit layout streaming data (for example, VD, VG, VD2, MD density, VD density, and VD pattern group, etc.). The method includes the scan result (scan data) labeled with circuit layout streaming data (block 202). In some embodiments, the EDA tool labels the scan data with the corresponding circuit layout streaming data. The method includes the grouping using multi-dimensional clustering (block 203). In some embodiments, different circuit layout streaming data are used to expand the scan data in the different dimensions and the decision subsystem is used to determine defects from the labeled scan data. The method includes using the grey level gain and image filter (block 204). In some embodiments, the grey level gain can be given for different grouping types to amplify the signal difference and the image filter can be used to process the different group images. The method includes picking up the outliers from each group (block 205). The method includes the DOI collection (block 206). The method includes performing the calibration by using RSEM, TEM, or cAFM, and etc. (block 207) The method includes that the calibrated results were labeled to multi-dimension groups which can pick an optimal/best group (block 208). The labeled circuit layout streaming data and labeled defects are generated based on the calibrated first image (circuit layout streaming data) and the calibrated second images (defects). The method can include tuning the automatic defect classification (ADC) based on optimal groups (block 209). The method includes using the final map of circuit layout streaming data and report including layout-feature groups to monitor the manufacturing process change in the wafer and variations for different defects (block 210).

The ADC is built only for one kind of defect, the known defect. The ADC is widely used for inspecting defects and measuring the patterned wafers. The ADC detects the presence of defects and automatically classifies defects to provide detailed feedback on the process. The ADC is used to distinguish between defects based on particulate contaminants on the surface of the wafer and types of defect associated with irregularities in the microcircuit pattern sample. The ADC system typically uses training data that contains a set of defects that have been pre-classified by an artificial expert. The ADC system uses training data to set the classification rules. When a classification of the ADC system involves more than three features, the multi-dimensional feature space may also be referred to as a hyperspace. However, the classification purity is the percentage of defects of the correct classification (eg, those found by the ADC system to be categorizable and not rejected) remaining. The classification metric is the percentage of defects that the ADC system cannot classify by credibility and thus return to be classified by an artificial expert (e.g., a system operator). Since there may be a certain percentage of defects rejected by the ADC system, the operator will have the greatest interest in the purity of the classification. The purity of the classification can be affected by various types of classification uncertainties. The unknown defects may be neglected when using conventional ADC systems.

Figure 3:
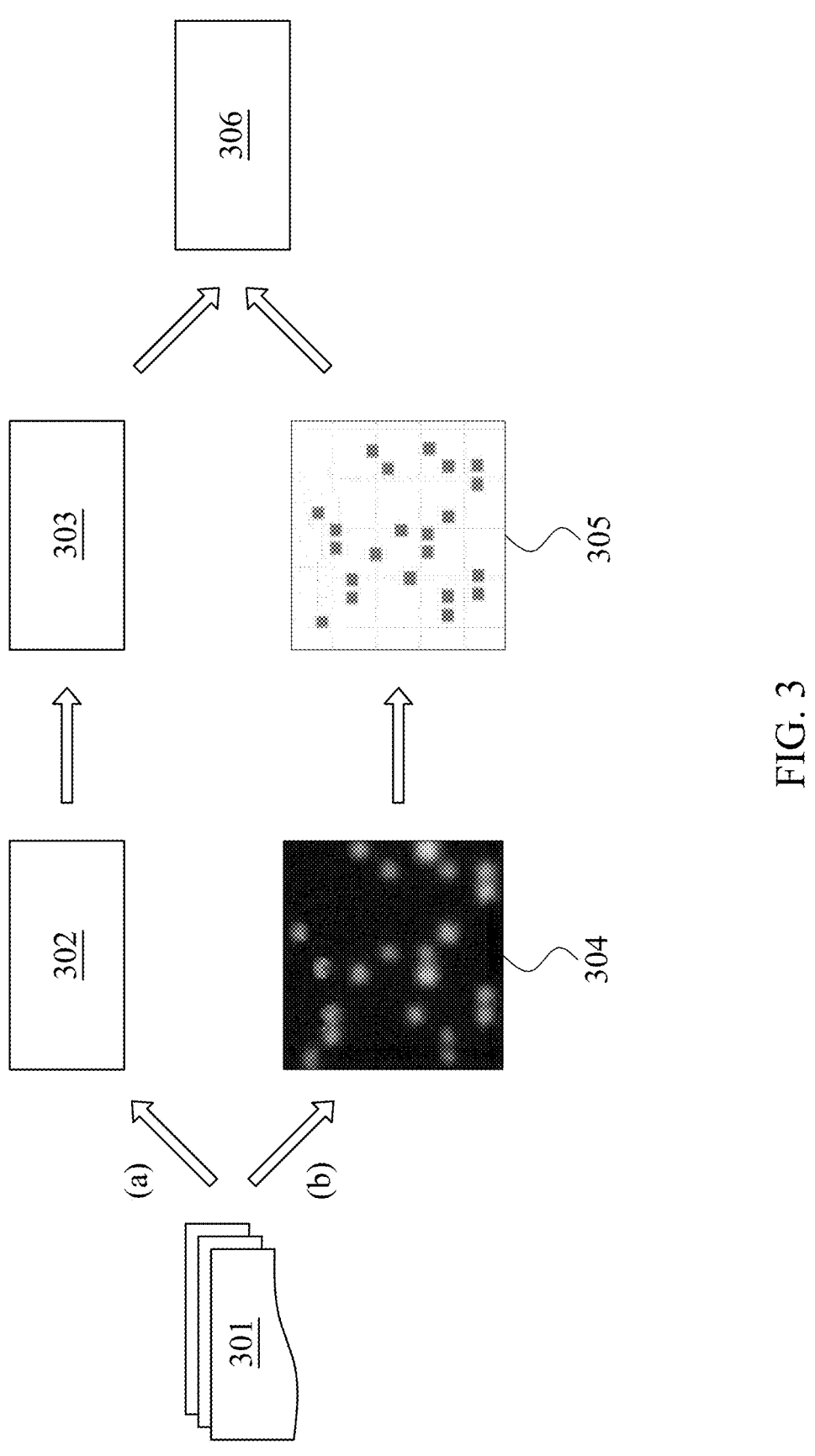
FIG. 3 is a flowchart of an embodiment of a method of correlating the scan data and the layout-features in accordance with some embodiments of the present disclosure.

FIG. 3 is a flowchart of an embodiment of a method of correlating the scan data and the layout-features in accordance with some embodiments of the present disclosure. The GDS location recorded by an EBI subsystem will have some offset from the actual value due to the stage accuracy. In order to calibrate the offset value, a patch image is converted to a binary image. The EBI raw data/scan data of the target region is acquired by the inspection subsystem 120 (step 301). Referring to arrow direction (a), the position/coordinate of the target region is obtained from the graphic design subsystem 112 (step 302). The GDS pattern/map of circuit layout streaming data is then clipped based on the position/coordinate of the target region (step 303). Referring to arrow direction (b), the scan data is converted into a binary image (step 304). The binary image is converted to contour image (step 305). Next, the scan data and the map of circuit layout streaming data are correlated (step 306). After performing the cross correlation, a location offset between the scan data and the map of circuit layout streaming data is calibrated. In some embodiments, the scan data and the map of circuit layout streaming data are correlated to determine the target region on the wafer. The map of circuit layout streaming data/GDS pattern is generated based on a GDS file. The scan data is labeled with a first attribute subset. The first attribute subset is selected from a portion of the map of circuit layout streaming data based on a correlation between the scan data and the map of circuit layout streaming data. In some embodiments, the GDS locations of the initial/original EBI scan result are obtained by auto-correlation between the EBI image and GDS image/file.

The circuit layout streaming data comprises vias, metal lines and/or channels. In some embodiments, the attributes for a via may include a length of a via, a width of the via, and the distance between the via and an adjacent via. In some embodiment, the attributes for a target via in the current layer may include: (a) the types of the target via, such as VD, VG and, etc.; (b) the size of the target via, such as length, width of the via and, etc.; (c) the distance between the target via and the adjacent via; (d) the pattern density calculated based on different distance from the center of the target via; (e) the surrounding pattern sharp group calculated based on different distances from the center of the target via; and (f) the groups of the target via defined by different optical proximity correction modules.

In some embodiments, the attributes for a target via in the current layer may include: (a) the position of the target via connected to the metal line (e.g., a metal over drain or a metal over gate) underlying the via (e.g., the distance from the line end); (b) the size (e.g., the length or the width) of the metal line underlying the connected target via, (c) the property of the metal line underlying the connected target via (such as N-channel or P-channel); (d) the metal surrounding pattern sharp of the metal line underlying the connected target via; (e) the pattern density of the metal line underlying the connected target via; (f) the relationship between the target via in the current layer and the connected conductive component in the further underlying layer (e.g., whether the target via is connected to a drain, a gate, and an oxide diffusion area in the further underlying layer); (g) the pattern densities in the underlying layer centered on the target via with different ranges (e.g., the pattern density of the oxide diffusion area connected to the target via and the pattern density of the metal over gate connected to the target via); and (h) the pattern groups in the underlying layer centered on the target via with different ranges (e.g., the pattern group of the oxide diffusion area connected to the target via and the pattern group of the metal over gate connected to the target via).

In some embodiments, the attributes for a target via in the current layer may include (a) the position of the target via connected to the metal line overlying the via (e.g., the distance from the line end); (b) the size (e.g., the length or the width) of the metal line overlying the connected target via; (c) the property of the metal line overlying the connected target via (such as N-channel or P-channel); (d) the metal surrounding pattern sharp of the metal line overlying the connected target via; (e) the pattern density of the metal line overlying the connected target via; (f) the relationship between the target via in the current layer and the connected conductive component in the further overlying layer.

The attributes for a metal line may include a pattern density of a metal line, a connection type between the metal line and a via underlying the metal line (e.g., single connection or double connections), and a connection type between the metal line and a second metal line underlying the metal line. In some embodiment, the attributes of the metal line may include (a) whether the metal line being connected to the gate, the source, and/or the drain; (b) the total area or the total area of metal line; (c) the size (e.g., the length or the width) of the metal line; (d) the environment of the source, drain, or gate connected to the metal line; and (e) the surrounding pattern sharp of the metal line.

Figure 4:
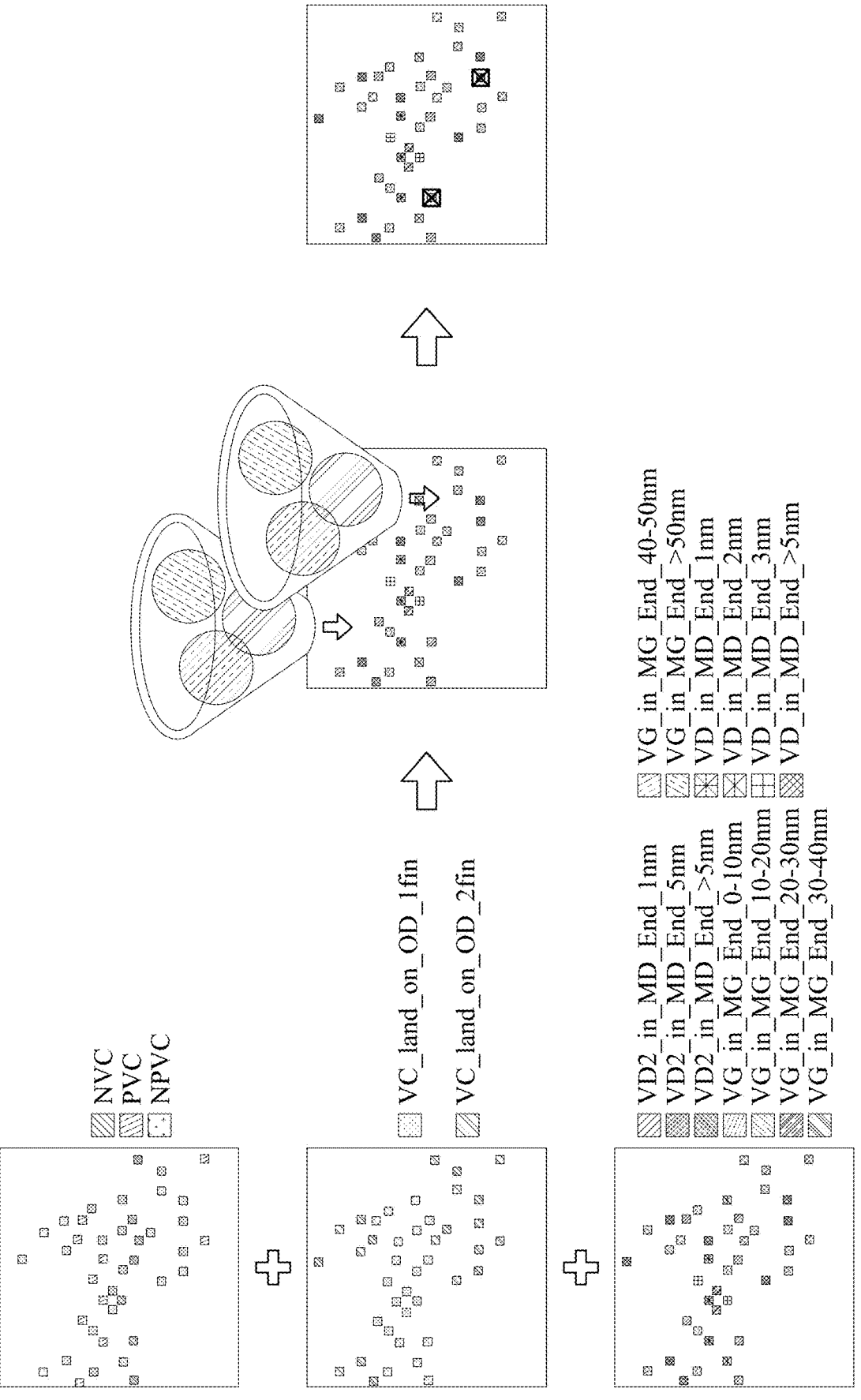
FIG. 4 is a diagram of the result of the scan data labeled with circuit layout streaming data in accordance with some embodiments of the present disclosure.

FIG. 4 is diagram of the result of the scan data labeled with circuit layout streaming data in accordance with some embodiments of the present disclosure. The EDA tool is configured to label the scan data with attributes from the map of circuit layout streaming data. The scan data including the target vias is labeled with different conditions. The defects may be located in one of the target vias. The result of the scan data with GDS locations can be labeled with different useful attributes based on position located in the map of circuit layout streaming data. Using the operation, 100 k defects can be labeled within 10 minutes (speed based on server power). Combined with process information, layout property, and pattern types, each defect can have different types of useful attributes for follow-up pattern grouping and analysis.

Figure 5A:
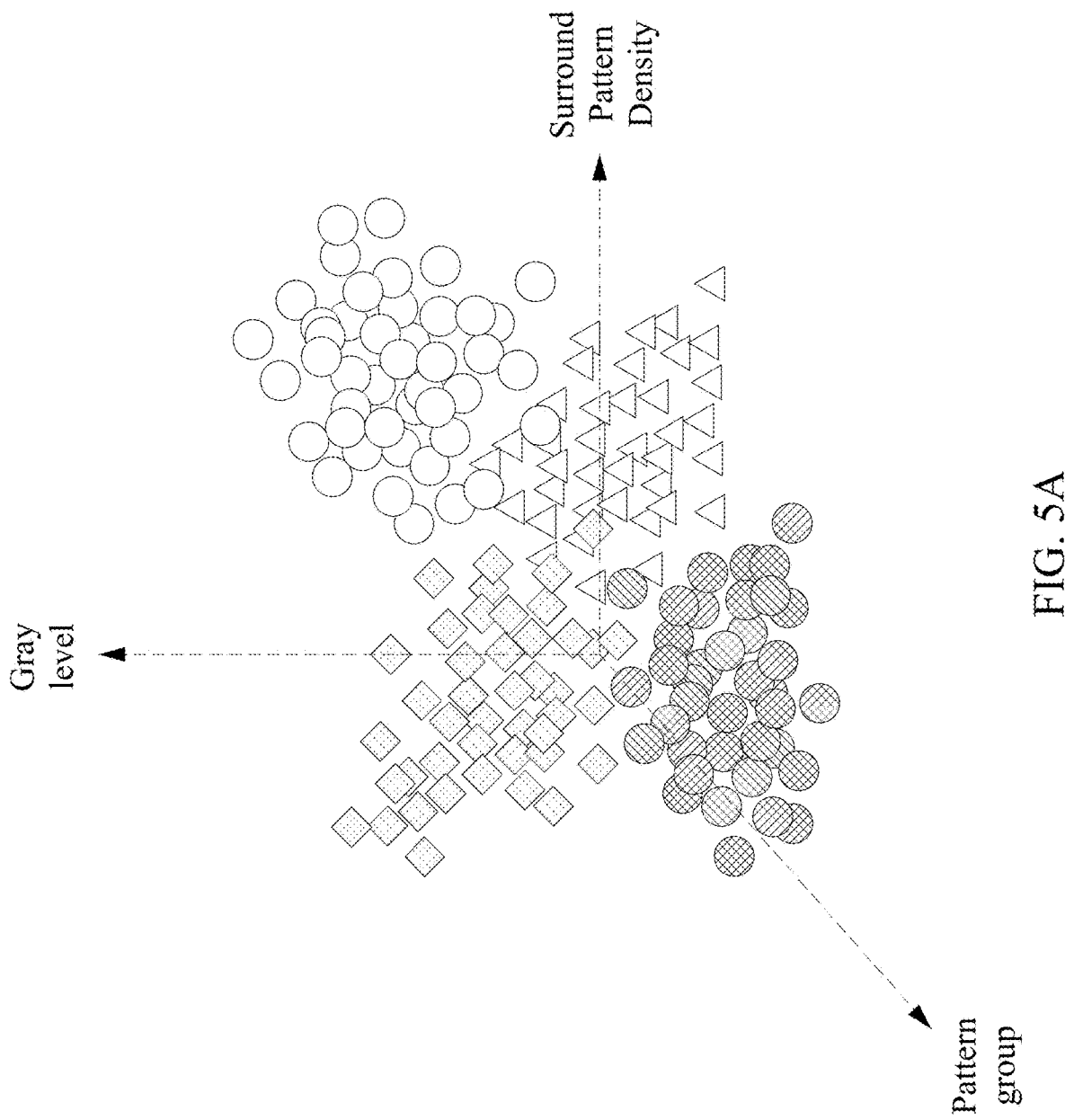
FIGS. 5A-5C are diagrams of a representation of a feature space having three axes in accordance with some embodiments of the present disclosure.
Figure 5B:
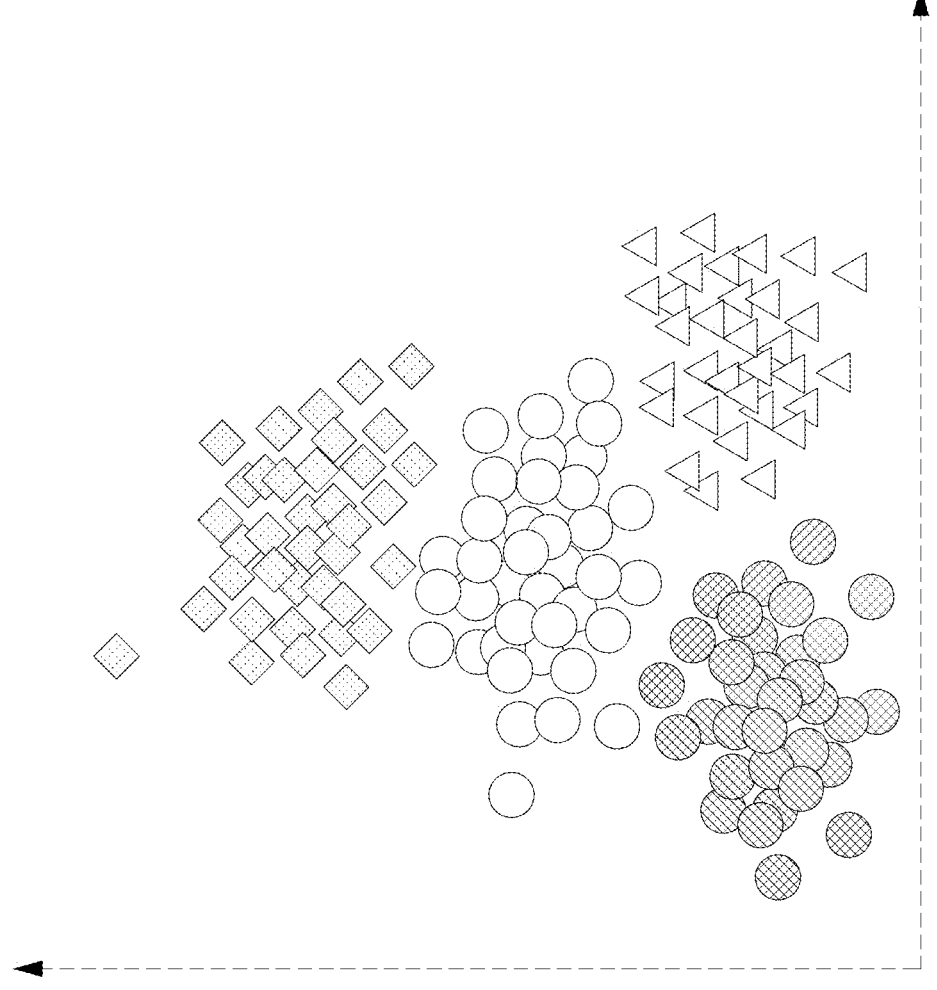
Figure 5C:
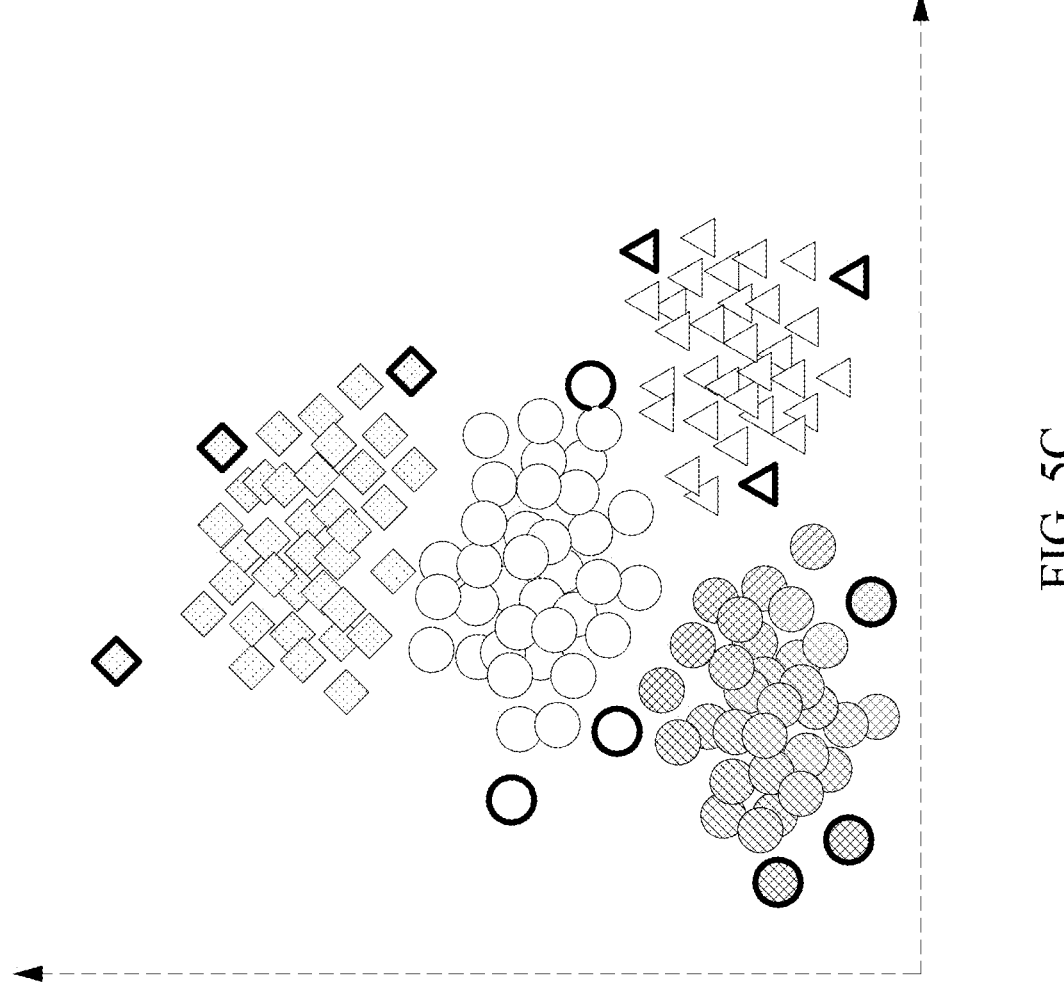
Figures 6A, 6B, 6C, 6D:
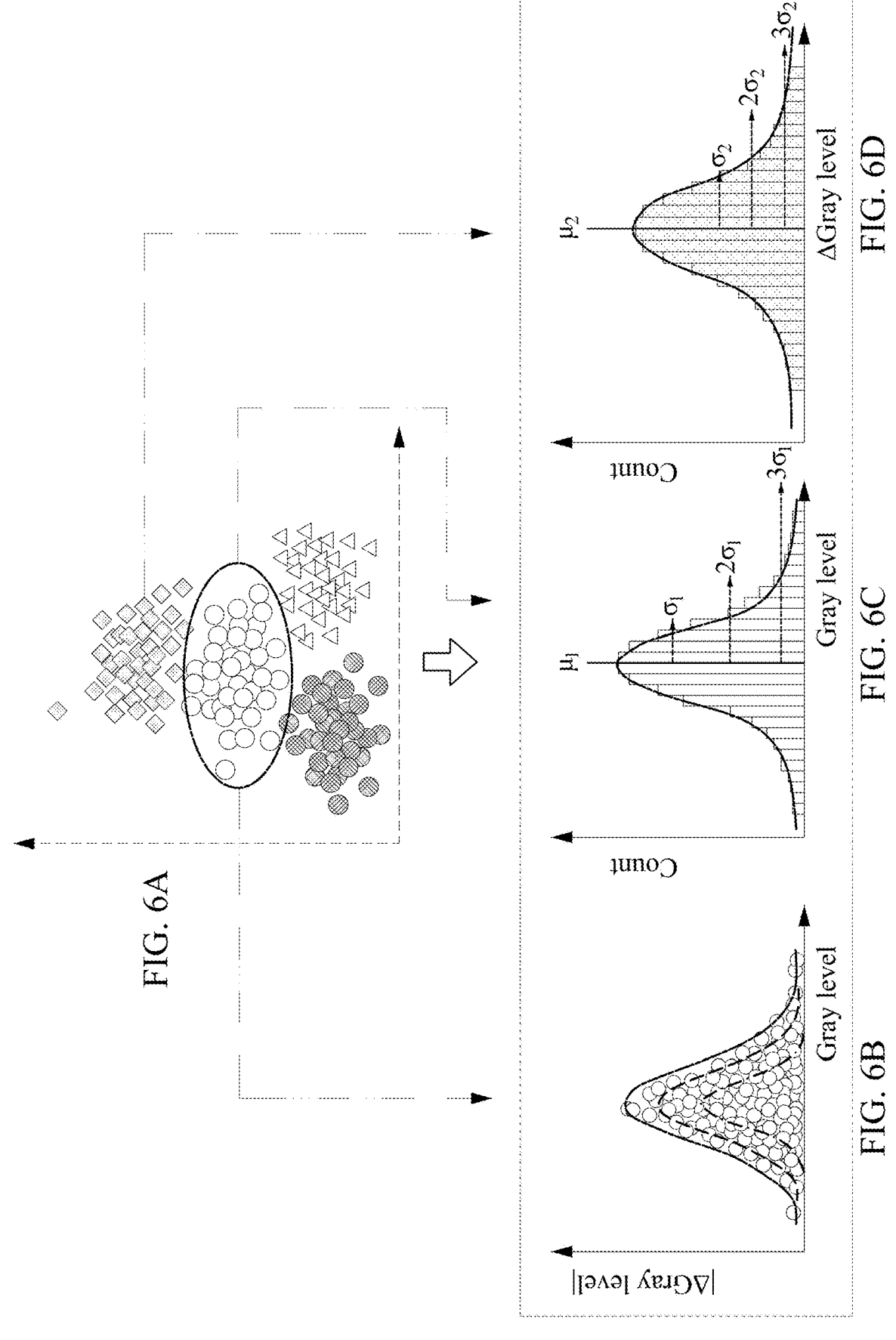
FIGS. 6A-6D are diagrams of a representation of expanding entry groups in accordance with some embodiments of the present disclosure.

FIGS. 5A-5C are diagrams of a representation of a feature space having three axes in accordance with some embodiments of the present disclosure. Referring to FIG. 5A, the decision subsystem 113 is configured to group a plurality of entries of the scan data into entry groups through the multi-dimension clustering method. The multi-dimension clustering method includes a clustering algorithm including one of K-Means, Mean-Shift, DBSCAN, OPTICS, or HDB-SCAN. The multi-dimensional clustering includes extending the labeled scan data to a multi-dimensional space based on the corresponding attributes. Using multi-dimensional clustering (e.g. K-Means, Mean-Shift, DBSCAN, OPTICS, HDBSCAN . . . ), the candidates of the data points with similar features can be grouped in multiple dimensions. Referring to FIG. 5B, the data points of the scan data in the multi-dimensional space are grouped on a projected plane having two axes.

Referring to FIG. 5C, the decision subsystem 113 is configured to determine outliers of each entry group as the defects (such as the outliers as shown in bold). Based on the labeled circuit layout streaming data, the defect diversity can be operated at two operational modes (such as manual and auto modes). From statistical analysis, the outliers from each group will be picked up by diversity sampling of the EBI defects. Manual mode includes user choice of circuit layout streaming data based on the process knowledge and lessons learned to identify the layout-related defects. Auto mode includes outliers of these clusters being identified based on multi-dimensional clustering with all circuit layout streaming data (such as: using Gaussian parameters to perform a review SEM (Scanning Electron Microscope) classification) .

FIGS. 6A-6D are diagrams of a representation of expanding entry groups in accordance with some embodiments of the present disclosure. The decision module 113 is configured to expand each entry group based on grey levels or delta grey levels of the scanned data and determine entries out of a deviation range (such as parameters of the delta grey levels: $\sigma$, $2\sigma$, or $3\sigma$) as defect. A good group can be expanded to a Gaussian-like shape distribution of $\Delta GL$. The Gaussian parameters (e.g. $\mu$, $\sigma$, $2\sigma$, $3\sigma$, . . . ) can provide fabrication monitoring. The points out of the $3\sigma$ range can be the candidates for the DOI diversity sampling. The $3\sigma$-$6\sigma$ could be used as the auto-threshold for the defect-to-nuisance filter. The candidates out of the threshold may be classified with the ReSEM result. After ReSEM classification, the defect percentage and the Gaussian parameters can be used to calculate the total defect level.

In some embodiments, an auto mode of the system 100 comprises using Gaussian parameters to perform the review SEM classification. In some embodiments, the Review SEM, similar to the defect inspection system, detects the defect by comparison with the circuit pattern of the adjacent die and obtains the correct position of the defect. The defect is then moved to the center of the field of view and an enlarged photo is taken. A Defect Review SEM is a Scanning Electron Microscope (SEM) configured to review defects found on a wafer. A defect detected by a semiconductor wafer defect inspection system is enlarged using a Review SEM to a high magnification image so that it can be reviewed and classified. A Defect Review SEM is mainly used together with the inspection systems in the production lines of electronic devices and other semiconductors. A good group/cluster could be expanded to a Gaussian-like shape distribution of $\Delta GL$. Using an algorithm of the Gaussian fit, the Gaussian parameters (e.g. $\mu$, $\sigma$, $2\sigma$, $3\sigma$, and . . . etc.) are obtained. The parameters could help to improve the fabrication of the wafer. The $1\sigma$~$6\sigma$ of Gaussian curve could be used as the auto threshold for defect-to-nuisance filter and defect diversity filter. The suspected defect will be individually sampled from $1\sigma$ to $6\sigma$ of Gaussian curves.

Figures 7A, 7B:
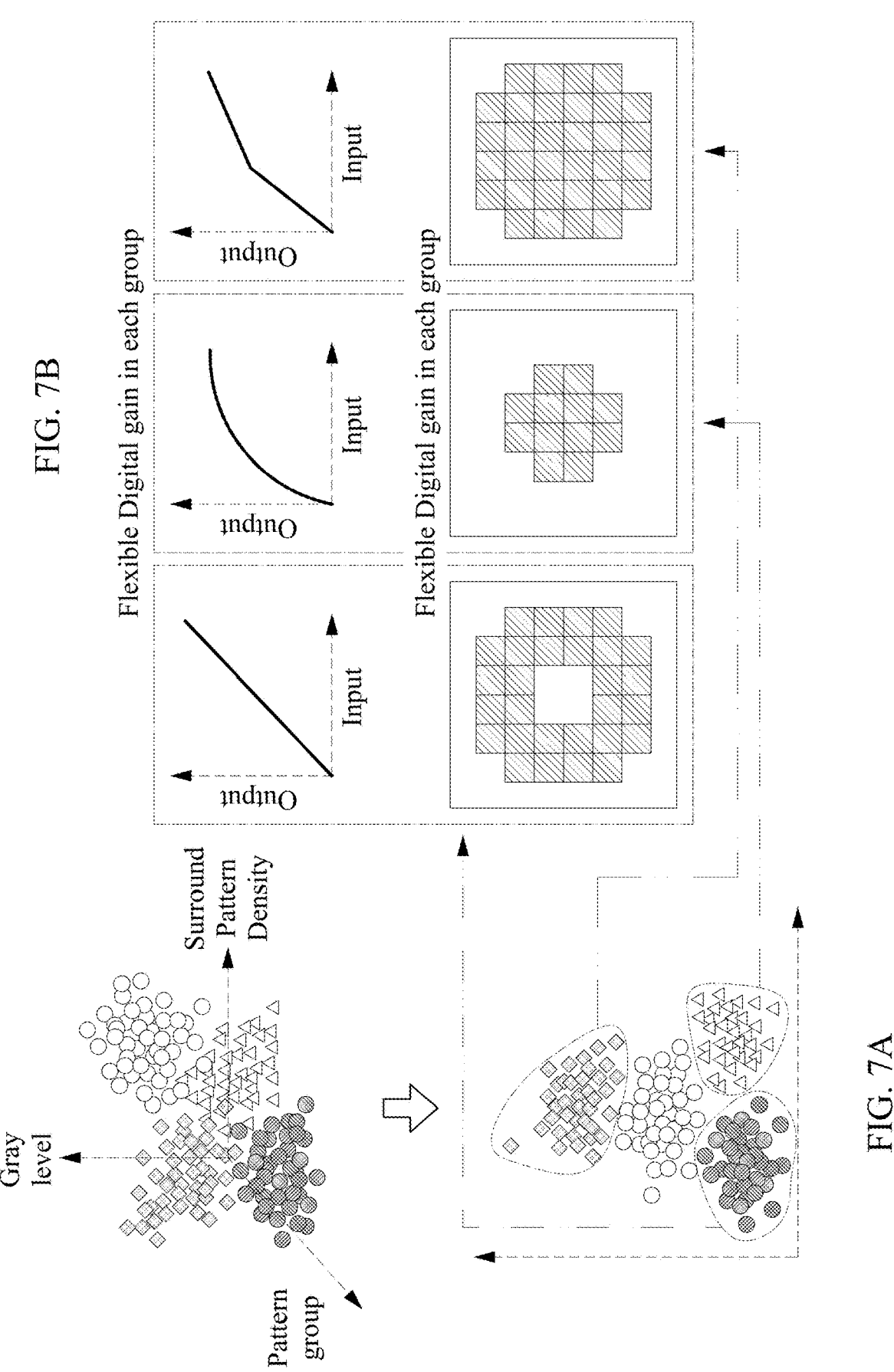
FIGS. 7A and 7B are diagrams of a representation of filtering the different groups in accordance with some embodiments of the present disclosure.

FIGS. 7A and 7B are diagrams of a representation of filtering the different groups in accordance with some embodiments of the present disclosure. The decision module 113 is configured to apply different types of gain to different groups and/or filter different groups by different types of filter. In some embodiments, the signal of some defects is weaker than others. In the original inspection, the defects are hidden by an predetermined threshold, which is generated from the high signal defects. Based on the layout-feature group, the weak signal defects can be identified from others. Some weak defect signals are not suitable for the general linear amplification. A non-liner amplification (e.g. exponential curve, n-power curve, multi-line curve, . . . ) can help to adjust the threshold between the defects and the nuisance. Some weak defects are hidden by the surrounding noise. Based on different layouts, the grouped defect image can be modified with individual image filter. Based on the individual digital gain and image filter in each group, one scan can cover multiple conditions and largely improve throughput of EBI detection. The image filter can suppress/decrease surrounding noise, and enhance the different images. By using a multi-dimension clustering method, these clusters can be grouped with multiple dimensions. The curve for each group can be separately finely tuned according to different features (such as: (a) reducing the scanning mode by a flexible-digital-gain tuning and improving the throughput; (b) VG and VD in N-channel/P-channel could be inspected in one scan test). Different nuisance filter can be applied to different groups to reduce nuisance and enhance the sensitivity.

After the ReSEM classification of one wafer, the original threshold ($1\sigma$-$6\sigma$ of Gaussian curves) for each group is individually chosen. For the stable process monitoring, at the beginning, the threshold of each group will be fixed. As more wafers are scanned, the defect properties of the circuit layout streaming data and signals are collected and summarized. Based on the multi-wafer results, the threshold for each group will be individually adjusted to reduce nuisance. The adjustment can be cyclical or real-time based on user definition. For experimental process monitoring, the threshold of each group will range from $1\sigma$-$6\sigma$ of Gaussian curves along the process variation. The defect level can be calculated with the defect percentage of each group and the relative Gaussian parameters.

Figure 8:
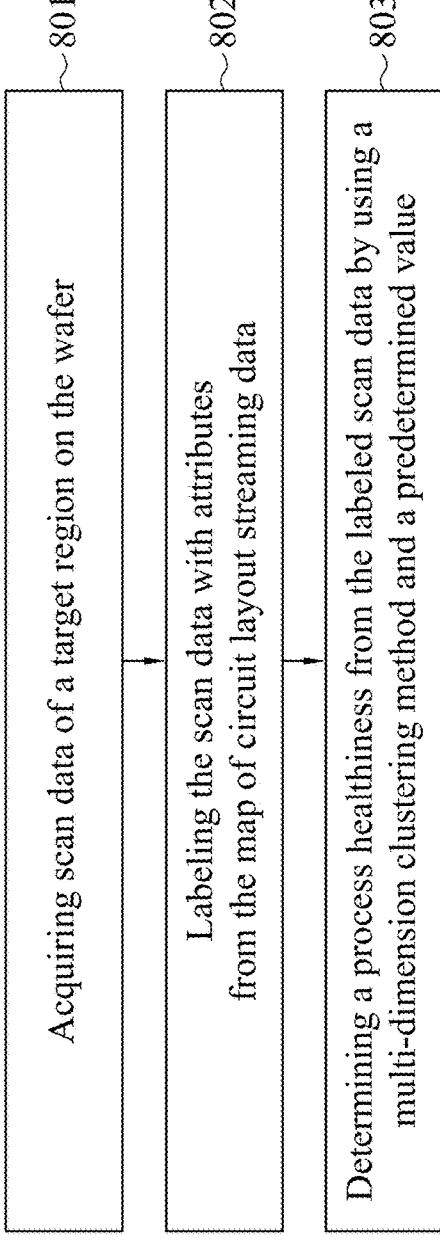
FIG. 8 is a flowchart of an embodiment of a method of defect detection on a wafer in accordance with some embodiments of the present disclosure.

FIG. 8 is a flowchart of an embodiment of a method 800 of detecting defects on a wafer 130 in accordance with some embodiments of the present disclosure. Before the qualifying of a semiconductor wafer process, a circuit layout is formed in a process chamber. After obtaining the wafer 130, the detecting method is performed. The method 800 includes acquiring scan data of a target region on the wafer 130 (block 801). The method 800 includes labeling the scan data with attributes from the map of circuit layout streaming data (block 802). In some embodiments, the circuit layout streaming data comprises vias and metal line. In some embodiments, the attributes comprise a length of a via, a width of the via, and the distance between the via and an adjacent via. In some embodiments, the scan data and the map of circuit layout streaming data are correlated to determine the target region on the wafer. The labeled circuit layout streaming data and labeled defects are generated based on the calibrated first image (circuit layout streaming data) and the calibrated second images (defects). The method 800 further comprises grouping a plurality of entries of the scan data into entry groups through the multi-dimension clustering method, wherein the multi-dimension clustering method comprises a clustering algorithm including one of K-Means, Mean-Shift, DBSCAN, OPTICS, or HDBSCAN.

The method 800 includes determining a process healthiness from the labeled scan data by using a multi-dimension clustering method and a predetermined value (block 803). In some embodiments, the method 800 further comprises determining outliers of each entry group as the defects. In some embodiments, the multi-dimension clustering method comprises extending the labeled scan data to a multi-dimensional space based on the corresponding attributes and wherein data points of the scan data in the multi-dimensional space are grouped on a projected plane.

In some embodiments, the method 800 may be used to improve the IC fabrication. An IC fab is an IC fabrication business that includes one or more manufacturing facilities for the fabrication of a variety of different IC products. In some embodiments, the IC Fab may be a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business. The known or unknown defect types in the wafer may cause the wafer to be broken. Therefore, a novel EBI inspection model/system for enhancing the purity of the EBI DOI detection is needed.

The IC fab may include a plurality of wafer fabrication tools configured to execute various manufacturing operations on a semiconductor wafer, such that an IC device is fabricated in accordance with the mask(s). In various embodiments, a plurality of fabrication tools may include one or more wafer steppers, an ion implanter, a photoresist coater, a process chamber, e.g., a chemical vapor deposition (CVD) chamber or Low-pressure CVD (LPCVD) furnace, a Chemical-Mechanical Planarization (CMP) system, a plasma etch system, a wafer cleaning system, or other manufacturing equipment capable of performing one or more suitable manufacturing processes. In some embodiment, the IC fab may use mask(s) fabricated by mask house to fabricate the IC device. During these manufacturing processes, the defects caused by using the plurality of fabrication tools need to be detected and improved by adjusting the parameters of the plurality of fabrication tools. Therefore, the EBI inspection system for detecting the defects may include a high accuracy when performing the detection.

The IC fab at least uses an IC design layout diagram to fabricate the IC device. In some embodiments, the wafer is fabricated by the IC fab by using mask(s) to form the IC device. In some embodiments, the IC fabrication includes performing one or more lithographic exposures based at least indirectly on IC design layout diagram. The wafer may include a silicon substrate or other proper substrate having material layers formed thereon. In addition, the wafer may further include one or more of various doped regions, dielectric features, multilevel interconnects, and the like (formed at subsequent manufacturing steps). In some embodiments, the active region, channel, via, metal line, and etc., may contain some defects due to the misalignment on the mask and the IC design layout diagram or nanosheet or gate-all-around (GAA) specific defects. Therefore, a novel EBI inspection model/system is needed to locate the unknown defect types and improve the EBI throughput and reduce EBI damage risk.

Figure 9:
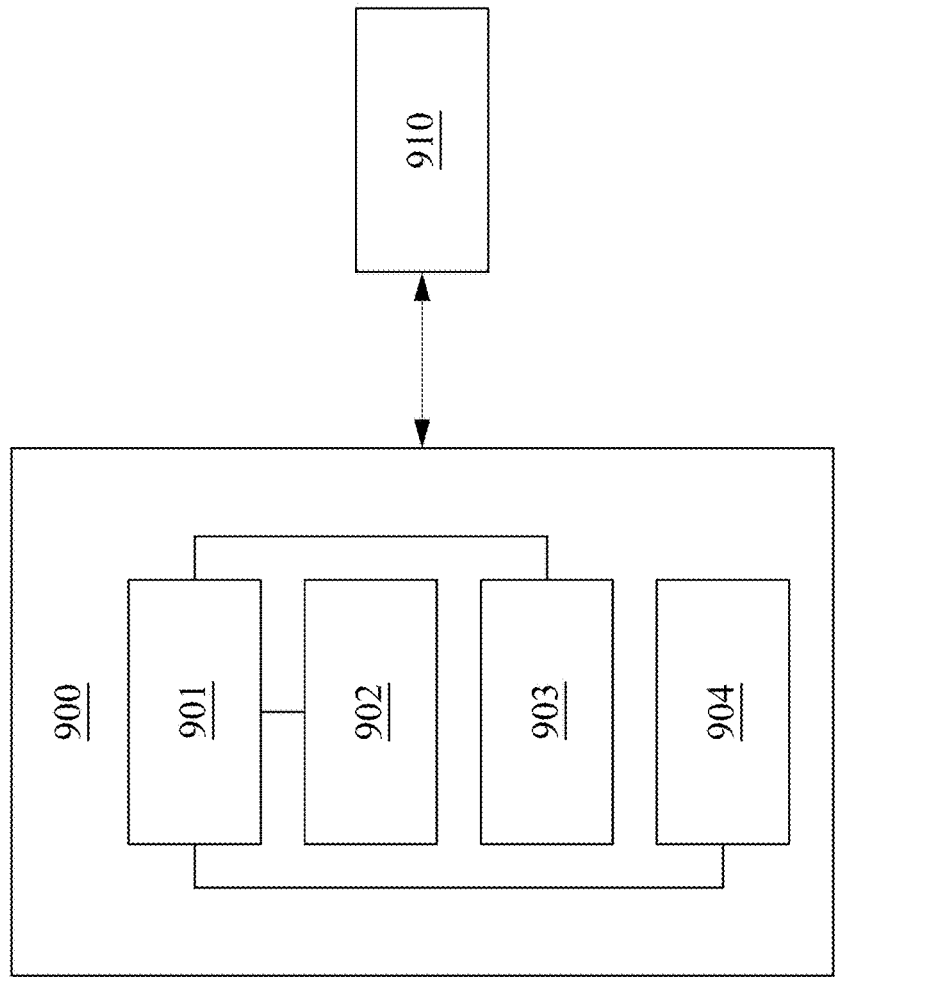
FIG. 9 is a computer system in accordance with some embodiments of the present disclosure.

FIG. 9 is a computer system 990 in accordance with some embodiments of the present disclosure. The computer system 990 is capable of performing one or more operations of the methods of the present disclosure. The computer system 990 includes a database 910 and a computing device 900. The computing device 900 may be a server computer, a client computer, a personal computer (PC), a tablet PC, a set-top box (STB), a personal digital assistant (PDA), a cellular telephone, or a smartphone. The computing device 900 comprises processor 901, input/output interface 902, communication interface 903, and memory 904. The database 910 may store criteria determining whether voltage-dependent design rule check (VDRC) is violated. In some embodiments, the input/output interface 902 is coupled with the processor 901. In some embodiments, the input/output interface 902 may allow a user to manipulate the computing device 900 in order to perform the methods of the present disclosure (e.g., the method disclosed in FIGS. 2 and 8). The communication interface 903 is coupled with the processor 901. In some embodiments, the communication interface 903 may allow the computing device 900 to communicate with the database 910. A memory 904 may be a non-transitory computer readable storage medium. The memory 904 is coupled with the processor 901. The memory 904 has stored program instructions that can be executed by one or more processors (for example, the processor 901). Upon execution of the program instructions stored on the memory 904, the program instructions cause performance of the one or more operations of the method disclosed in the present disclosure. For example, the memory 904 having stored thereon program instructions that, upon execution by the processor 901, cause the computing device 900 to perform a set of acts that at least include: acquiring scan data of a target region on the wafer 130, wherein the target region comprises circuit layout streaming data on the wafer and the defects in proximity to the circuit layout streaming data or in the circuit layout streaming data; labeling label the scan data with attributes from the map of circuit layout streaming data; and determining the defects from the labeled scan data using multi-dimensional clustering.

According to some embodiments, a system configured to detect defects on a wafer comprises an inspection subsystem configured to acquire scan data of a target region on the wafer, wherein the target region comprises circuit layout streaming data on the wafer and the defects in proximity to the circuit layout streaming data or in the circuit layout streaming data, and wherein a GDS is configured to store a layout feature map of circuit layout streaming data of the wafer, an EDA tool is configured to label the scan data with attributes from the map of circuit layout streaming data, and a decision subsystem is configured to determine defects from the labeled scan data using multi-dimensional clustering.

According to other embodiments, a method for detecting defects on a wafer comprises acquiring scan data of a target region on the wafer, wherein the target region comprises circuit layout streaming data on the wafer and the defects in proximity to the circuit layout streaming data or in the circuit layout streaming data; labeling the scan data with attributes from the map of circuit layout streaming data; and determining the defects from the labeled scan data using multi-dimensional clustering.

According to other embodiments, a non-transitory computer-readable medium having stored thereon program instructions that, upon execution by a processor, cause performance of a set of acts comprising acquiring scan data of a target region on the wafer, wherein the target region comprises circuit layout streaming data on the wafer and the defects in proximity to the circuit layout streaming data or in the circuit layout streaming data; labeling label the scan data with attributes from the map of circuit layout streaming data; and determining the defects from the labeled scan data using multi-dimensional clustering.

The methods and features of the present disclosure have been sufficiently described in the above examples and descriptions. It should be understood that any modifications or changes without departing from the spirit of the present disclosure are intended to be covered in the protection scope of the present disclosure.

Moreover, the scope of the present application in not intended to be limited to the particular embodiments of the process, machine, manufacture, and composition of matter, means, methods and steps described in the specification. As those skilled in the art will readily appreciate from the present disclosure, processes, machines, manufacture, composition of matter, means, methods or steps presently existing or later to be developed, that perform substantially the same function or achieve substantially the same result as the corresponding embodiments described herein, may be utilized according to the present disclosure.

Accordingly, the appended claims are intended to include within their scope: processes, machines, manufacture, compositions of matter, means, methods or steps. In addition, each claim constitutes a separate embodiment, and the combination of various claims and embodiments are within the scope of the present disclosure.

What is claimed is:

1. A system configured to qualify a semiconductor wafer process, comprising:
   an inspection subsystem configured to acquire scan data of a target region on a semiconductor wafer, wherein the target region comprises circuit layout streaming data on the semiconductor wafer and a plurality of defects in proximity to the circuit layout streaming data or in the circuit layout streaming data;
   a graphic design subsystem (GDS) configured to store a map of the circuit layout streaming data of the semiconductor wafer;
   a software tool for designing electronic systems configured to label the scan data with attributes from the map of the circuit layout streaming data; and
   a decision subsystem configured to qualify the semiconductor wafer process based on a predetermined defect level from the labeled scan data by using a multi-dimension clustering method, wherein the predetermined defect level is an accumulated defect formed on the semiconductor wafer during processing,
   wherein the decision subsystem is configured to group a plurality of entries of the scan data into entry groups through the multi-dimension clustering method,
   wherein the decision subsystem is configured to expand each entry group based on grey levels of the scan data and determine entries out of a deviation range as the defects, and wherein the decision subsystem is configured to apply different types of gains to different entry groups and filter different entry groups by different types of filters.

2. The system of claim 1, wherein the scan data is based on an electron beam inspection (EBI) image, and the EBI image includes the circuit layout streaming data and the defects.

3. The system of claim 1, wherein the circuit layout streaming data comprises vias and metal lines.

4. The system of claim 1, wherein the attributes comprise a length of a via, a width of the via, and a distance between the via and an adjacent via.

5. The system of claim 1, wherein the attributes comprise a pattern density of a metal line, a connection type between the metal line and a via underlying the metal line, and a connection type between the metal line and a second metal line underlying the metal line.

6. The system of claim 1, wherein the scan data and the map of the circuit layout streaming data are correlated to determine the target region on the semiconductor wafer.

7. The system of claim 6, wherein the scan data is labeled with a first attribute subset, wherein the first attribute subset is selected from a portion of the map of the circuit layout streaming data based on a correlation between the scan data and the map of the circuit layout streaming data.

8. The system of claim 1, wherein the multi-dimension clustering method comprises a clustering algorithm including one of K-Means, Mean-Shift, DBSCAN, OPTICS, or HDBSCAN.

9. The system of claim 8, wherein the decision subsystem is configured to determine outliers of each entry group as the defects.

10. The system of claim 1, wherein the multi-dimension clustering method comprises extending the labeled scan data to a multi-dimensional space based on the corresponding attributes and wherein data points of the scan data in the multi-dimensional space are grouped on a projected plane.

11. The system of claim 1, wherein the defects further comprise defects of an EUV (Extreme ultraviolent lithography) process, defects of an epitaxy, defects of misalignment, or Nanosheet or gate-all-around (GAA) specific defects.

12. A system configured to qualify a semiconductor wafer process, comprising:

an inspection subsystem, configured to acquire scan data of a target region on a semiconductor wafer, wherein the target region comprises circuit layout streaming data on the semiconductor wafer and a plurality of defects in proximity to the circuit layout streaming data or in the circuit layout streaming data;

a graphic design subsystem (GDS), configured to store a map of the circuit layout streaming data of the semiconductor wafer;

a software tool, configured to label the scan data with attributes from the feature map of the circuit layout streaming data; and a decision subsystem, configured to determine a process healthiness from the labeled scan data by using a multi-dimension clustering method and a predetermined value, wherein the decision subsystem is configured to group a plurality of entries of the scan data into entry groups through the multi-dimension clustering method, wherein the decision subsystem is configured to expand each entry group based on grey levels of the scan data and determine entries out of a deviation range as the defects, and wherein the decision subsystem is configured to apply different types of gains to different entry groups and filter different entry groups by different types of filters.

13. The system of claim 12, wherein the circuit layout streaming data comprises vias and metal lines.

14. The system of claim 12, wherein the attributes comprise a length of a via, a width of the via, and a distance between the via and an adjacent via.

15. The system of claim 12, wherein the scan data and the map of circuit layout streaming data are correlated to determine the target region on the wafer.

16. The system of claim 12, wherein the labeled circuit layout streaming data are generated based on a calibrated first image and calibrated second images obtained from the circuit layout streaming data and the defects.

17. The system of claim 12, wherein the decision subsystem is configured to group a plurality of entries of the scan data into entry groups through the multi-dimension clustering method, and determine outliers of each entry group as the defects.

18. The system of claim 12, wherein the multi-dimension clustering method comprises extending the labeled scan data to a multi-dimensional space based on the corresponding attributes and wherein data points of the scan data in the multi-dimensional space are grouped on a projected plane.

19. A system configured to qualify a semiconductor wafer process, comprising:

an inspection subsystem, configured to acquire scan data of a target region on a semiconductor wafer, wherein the target region comprises circuit layout streaming data on the semiconductor wafer and a plurality of defects in proximity to the circuit layout streaming data or in the circuit layout streaming data;

a graphic design subsystem (GDS), configured to store a layout feature map of the circuit layout streaming data of the semiconductor wafer;

a software tool, configured to label the scan data with attributes from the feature map of the circuit layout streaming data; and a decision subsystem, configured to determine the plurality of defects from the labeled scan data using a multi-dimension clustering method, wherein the decision subsystem is configured to group a plurality of entries of the scan data into entry groups through the multi-dimension clustering method, wherein the decision subsystem is configured to expand each entry group based on grey levels of the scan data and determine entries out of a deviation range as the defects, and wherein the decision subsystem is configured to apply different types of gains to different entry groups and filter different entry groups by different types of filters.

20. The system of claim 19, wherein the scan data is based on an electron beam inspection (EBI) image, and the EBI image includes the circuit layout streaming data and the defects.

* * * * *